under review United States Patent [19]

Hsieh et al.

[11] Patent Number: 5,084,372
[45] Date of Patent: Jan. 28, 1992

[54] PROCESS FOR PREPARING PHOTOGRAPHIC ELEMENTS UTILIZING LIGHT-SENSITIVE LAYER CONTAINING CYCLICAL ACID AMIDE THERMO-CROSSLINKING COMPOUND

[75] Inventors: Shane Hsieh, Bridgewater, N.J.; Paul Stahlhofen, Wiesbaden, Fed. Rep. of Germany

[73] Assignee: Hoechst Celanese Corporation, Somerville, N.J.

[21] Appl. No.: 645,085

[22] Filed: Jan. 23, 1991

Related U.S. Application Data

[60] Division of Ser. No. 480,775, Feb. 16, 1990, Pat. No. 5,008,175, which is a continuation of Ser. No. 549,059, Nov. 7, 1983, abandoned.

[30] Foreign Application Priority Data

Dec. 12, 1982 [DE] Fed. Rep. of Germany ....... 3246037

[51] Int. Cl.$^5$ .......... G03C 5/00; G03C 1/52; G03C 1/54; G03C 1/72
[52] U.S. Cl. .......... 430/296; 430/155; 430/157; 430/165; 430/170; 430/175; 430/191; 430/270; 430/278; 430/280; 430/309; 430/325; 430/326; 430/330; 430/350; 430/942; 430/945
[58] Field of Search .......... 430/191, 165, 170, 155, 430/141, 175, 270, 280, 325, 330, 309, 350, 296

[56] References Cited

U.S. PATENT DOCUMENTS

| | | | |
|---|---|---|---|
| 3,402,044 | 9/1968 | Steinhoff et al. | 430/191 |
| 3,660,097 | 5/1972 | Mainthia | 430/192 |
| 4,108,664 | 8/1978 | DeBoer et al. | 430/191 |
| 4,164,421 | 8/1979 | Shinozaki et al. | 430/191 |
| 4,191,570 | 3/1980 | Herting et al. | 430/302 |
| 4,247,616 | 1/1981 | Vikesland et al. | 430/192 |
| 4,259,430 | 3/1981 | Kaplan et al. | 430/192 |
| 4,387,152 | 6/1983 | Stahlhofen | 430/191 |

FOREIGN PATENT DOCUMENTS

| | | |
|---|---|---|
| 1151199 | 10/1966 | United Kingdom . |
| 1154749 | 6/1969 | United Kingdom . |
| 1555233 | 11/1979 | United Kingdom . |

OTHER PUBLICATIONS

DeForest, W. S. "Photoresist Materials and Processes" McGraw-Hill Co., 1975, pp. 47–49 and 55–59.
Hawley, G. "The Condensed Chemical Dictionary", 10th Ed. 1981, p. 649.
Vogel, Arthur, I., Practical Organic Chemistry, 3rd Ed., 1956, pp. 1017–1018, John Wiley, and Sons.
Schildknecht, Calvin E. "Polymer Processes", 1956, pp. 300–305, Interscience Publishers Inc.
Resimene, product brochure from Monstanto, 1983.

*Primary Examiner*—Charles L. Bowers, Jr.
*Assistant Examiner*—Christopher G. Young
*Attorney, Agent, or Firm*—Richard S. Roberts

[57] ABSTRACT

A light-sensitive composition for the preparation of printing plates is described, which contains a water-insoluble binder which is soluble in aqueous-alkaline solutions; a light-sensitive component which is an o- or p-quinone diazide, a diazonium salt polycondensation product or a mixture of a) a compound which eliminates an acid on exposure to light and b) a compound having at least one C—O—C group which can be split by acid; and a thermo-crosslinking compound which is a cyclical acid amide of the general formula:

$$\begin{array}{c} R-O-CH_2 \quad CH_2-O-R \\ \diagdown \diagup \\ N \\ | \\ C \\ \diagup \diagdown \\ R-O-H_2C \quad N = \quad N \quad CH_2-O-R \\ \diagdown \diagup \diagdown \diagup \\ N-C \quad C-N \\ \diagup \quad \diagdown \diagup \quad \diagdown \\ R-O-H_2C \quad N \quad CH_2-O-R \end{array}$$

wherein R denotes a hydrogen atom or an alkyl group. The printing plates can be baked at lower temperatures than plates without a crosslinking agent, but nevertheless have a long shelf life.

20 Claims, No Drawings

PROCESS FOR PREPARING PHOTOGRAPHIC ELEMENTS UTILIZING LIGHT-SENSITIVE LAYER CONTAINING CYCLICAL ACID AMIDE THERMO-CROSSLINKING COMPOUND

This is a division of co-pending application Ser. No. 07/480,775 filed on Feb. 16, 1990, now U.S. Pat. No. 4,008,175, which was a continuation of co-pending application Ser. No. 06/549,059 filed on Nov. 7, 1983, now abandoned.

BACKGROUND OF THE INVENTION

The present invention relates to a light-sensitive composition, light-sensitive photographic element prepared from this composition, and a process for the preparation of a printing plate from this composition.

The invention more particularly relates to a light-sensitive mixture which contains a substantially water-insoluble binder, which is soluble in aqueous-alkaline solutions, and a light-sensitive compound. The invention further relates to a light-sensitive photographic element composed of a support and a light-sensitive layer comprising the aforesaid composition. The invention still further relates to a process for the preparation of a printing plate by exposing, developing and heating the produced photographic element.

Processes for the preparation of printing plates by heating or baking the image layer of exposed and developed copying materials have been disclosed, for example, in British Patent Specifications 1,151,199 and 1,154,749. In these processes, a light-sensitive copying material, which is either positive-working and preferably contains an o-quinone-diazide or is negative-working and preferably contains a p-quinone-diazide, is exposed imagewise, developed and then heated to a temperature above 180° C. for such a period and to such a temperature level that the image background, previously developed cleanly, is stained by thermal decomposition products of the image layer. Subsequently, the image background is cleaned again by once more treating it with developer solution. Normally, temperatures of 220°-240° C. are used for heating, and the duration of heating is about 5-60 minutes. This post-treatment achieves a hardening of the printing layer and hence a considerable extension of the print run. When the baking temperatures are at the upper limit of the indicated range, the required baking times are of course relatively short. It has been found that the use of relatively high temperatures in this process is disadvantageous. On the one hand, these temperatures cause the formation of a relatively firmly adhering precipitate in the background areas, and this can be cleanly removed only by means of quite aggressive solutions, and there is also a risk of an attack on the desired printing image. Moreover, at the relatively high baking temperatures or with the relatively long baking times, there is a risk of the conventionally used supports of aluminum being deformed and thus of the printing plate obtained being damaged or rendered useless.

As described in German Offenlegungsschrift 2,626,473, the first-mentioned disadvantage can be avoided by coating the background surface, before baking, with a layer of a water-soluble organic substance or an inorganic salt, which layer can be readily washed off after baking. Related treatments may be found in U.S. Pat. No. 4,191,570. To prevent a deformation of the support, it would be desirable however, to be able to bake at lower temperatures.

German Offenlegungsschrift DE-A 30 39 926 discloses a light-sensitive mixture of the type described above, which, in addition to a light-sensitive compound and an alkali-soluble binder, contains a phenol derivative with 2 to 4 hydroxymethyl groups. By the addition of the phenol derivative, the baking temperature can be reduced to less than 200° C. It is, however, a disadvantage of this material that it possesses an unsatisfactory developer resistance and a flat gradation. Also, it has a reduced shelf life which is due to its content of reactive phenol derivative.

The instant invention provides a light-sensitive mixture, and a photographic element prepared from this mixture, which enables baking to be carried out at lower temperatures without substantially reducing the shelf life and developer resistance of such elements.

SUMMARY OF THE INVENTION

The invention is based on a light-sensitive mixture which contains a substantially water-insoluble binder, which is soluble in aqueous-alkaline solution; and a photosensitive component which is a light-sensitive o- or p- quinone-diazide, a diazonium salt polycondensation product, or a mixture of a) a compound which eliminates an acid on exposure to light and b) a compound having at least one C—O—C group which can be split by acid, and a thermo-crosslinking compound.

The mixture of the invention is characterized in that the thermo-crosslinking compound is a cyclical acid amide of the general formula:

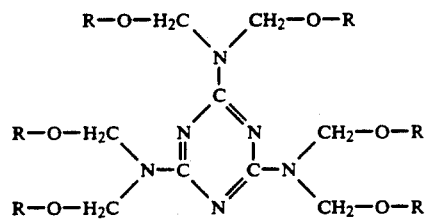

wherein R denotes a hydrogen atom or an alkyl group.

DETAILED DESCRIPTION OF THE PREFERRED EMBODIMENT

According to the invention, a light-sensitive photographic element is provided which is composed of a support and a light-sensitive layer constituted by the mixture defined above.

Moreover, according to the invention, a process for the preparation of a printing plate is proposed, wherein the above light-sensitive photographic element, composed of a support and a light-sensitive layer which contains a water-insoluble binder, which is soluble in aqueous-alkaline solutions; and a light-sensitive o- or p-quinone-diazide, a diazonium salt polycondensation product or a mixture of a) a compound which eliminates an acid on exposure to the light and b) a compound having at least one C—O—C group which can be split by acid; and a thermo-crosslinking compound, is exposed imagewise, the non-image areas of the layer are washed out with an aqueous alkaline developer solution and the material is then heated to an elevated temperature in order to harden the image layer.

The process of the invention is characterized in that the thermo-crosslinking compound is a cyclical acid amide of the general formula:

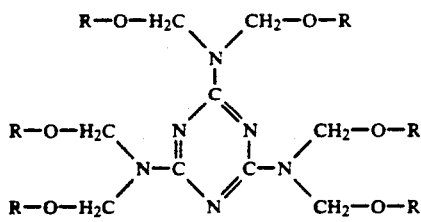

wherein R denotes a hydrogen atom or an alkyl group.

Since hexamethylol melamine is relatively difficultly soluble in organic solvents, the corresponding, at least partially etherified compounds are preferably employed. In general, the alkyl ether groups have 1 to 10, preferably 1 to 4, carbon atoms. Methyl ethers are particularly preferred. Further, the hexaalkyl ethers are usually preferred over the partially etherified compounds.

The concentration of the thermo-crosslinking melamine compounds of this invention in the light-sensitive mixture can be varied within relatively wide limits. In general, they are present in amounts of from about 1 to about 20, preferably of from about 4 to about 10 percent by weight, relative to the non-volatile constituents (solids) of the light-sensitive mixture.

At normal ambient temperatures the reactivity of the compounds towards the crosslinking groups —CH$_2$—O—R obviously is not high enough for a premature crosslinking of the layer, so that copying layers which are stored at room temperature in the unexposed state have a long shelf life. This is a least the case when the concentrations of crosslinking agent lies within the above indicated preferred range, these concentrations being considerably inferior to those of the phenol derivatives used in accordance with German Offenlegungsschrift DE-A 30 39 926.

Additionally, the light-sensitive mixtures according to the invention contain a light-sensitive compound. Positive-working compounds that is to say those which are rendered soluble by exposure, are most suitable for the purpose of the present invention. They include o-quinone-diazides and combinations of photolytic acid donors and compounds which can be split by acid, such as ortho-carboxylic acid compounds and acetal compounds. p-quinone diazides and diazonium salt polycondensation products are also suitable light-sensitive compounds.

The mixture and process according to the invention have particular advantages in connection with light-sensitive materials based on o-quinone-diazides, since in this case a particularly large increase in the number of prints is obtained by baking. Suitable materials of this type are known and described, for example, in German patents DE-C No. 938,233 and in DE-A Nos. 2,331,377, 2,547,905 and 2,828,037 which are incorporated herein by reference. The preferred o-quinone-diazides are naphthoquinone-(1,2)-diazide-(2)-4- or 5-sulfonic acid esters or amides. Amongst these, esters, in particular those of the 5-sulfonic acid, are particularly preferred. In general, the quantity of o-quinone-diazide compounds is 3 to 50% by weight, preferably 7 to 35% by weight, relative to the non-volatile constituents (solids) of the mixture.

Materials based on compounds which can be split by acid can also be baked with good effect and used in the process according to the invention.

Copying materials of this type are known and described, for example, in U.S. Pat. Nos. 3,779,778 and 4,101,323, German patents DE-C No. 2,718,254 and in DE-A Nos. 2,829,512 and 2,829,511 all of which are incorporated herein by reference. As the compounds which can be split by acid, they contain ortho-carboxylic acid derivatives, monomeric or polymeric acetals, enol ethers or acyliminocarbonates. As the compounds which are sensitive to radiation and eliminate acid, they predominantly contain organic halogen compounds, in particular s-triazines which are substituted by halogenomethyl groups.

Among the ortho-carboxylic acid derivatives described in U.S. Pat. No. 4,101,323, the bis-1,3-dioxan-2-yl ethers of aliphatic diols are particularly preferred.

Among the polyacetals described in DE-C No. 2,718,254, those with aliphatic aldehyde units and diol units are preferred.

Further, very suitable mixtures are described in German Offenlegungsschrift DE-A No. 29 28 636. In the latter, polymeric ortho-esters with recurrent ortho-ester groups in the main chain are described as compounds which can be split by acid. These groups are 2-alkyl ethers of 1,3-dioxacycloalkanes having 5 or 6 ring members. Polymers with recurrent 1,3-dioxa-cyclohex-2-yl alkyl ether units, in which the alkyl ether group can be interrupted by ether oxygen atoms and is preferably bonded to the 5-position of the adjacent ring, are particularly preferred.

The quantitative proportion of the compounds which can be split by acid in the light-sensitive mixture is in general between 8 and 65% by weight, preferably between 14 and 44% by weight, relative to the non-volatile constituents (solids) of the mixture. The quantity of the compound which eliminates acid is between 0.1 and 10% by weight, preferably between 0.2 and 5% by weight.

Additionally, the light-sensitive mixtures according to the invention contain a polymeric, water-insoluble resinous binder which is soluble in the solvents used for the mixture according to the invention and is also soluble, or at least swellable, in aqueous alkalis.

The novolak condensation resins, well-established in many positive copying materials based on naphthoquinone-diazides have proved to be particularly useful and advantageous as an additive in the mixture according to the invention. They enhance the sharp differentiation between exposed and unexposed layer areas on development. This is particularly true for the more highly condensed resins with substituted phenols, for example cresols, as the partners for the condensation with formaldehyde. The nature and quantity of the novolak resins can vary depending on the intended purpose; preferably, the proportions of novolak in the total solids are between 50 and 90% by weight, and particularly preferably they are 60–80% by weight. Moreover, numerous other resins can also be used additionally. Preferably these may be one or more vinyl polymers, such as polyvinyl acetates, polyacrylates, polyvinyl ethers, polyvinyl acetals, polyvinylpyrrolidones and copolymers of the monomers on which these are based. The most advantageous proportion of these resins depends on the technological requirements and on the influence on the development conditions desired. In general, this is not more than about 20% by weight of the alkali-soluble resin. To meet special requirements, such as flexibility, adhesion, gloss, coloration and color change, and the like, the light-sensitive mixture can additionally also contain small amounts of substances, such as polyglycols, cellulose derivatives, such as ethylcellulose, surfactants, dyes, adhesion-promoters and finely divided pigments, and UV absorbers, if desired. Natural resins, such as shellac and colophony, and synthetic resins, such as copolymers of styrene and maleic anhydride or copolymers of acrylic acid or methacrylic acid, in particular with acrylates or methacrylates are further binders which are soluble or swellable in aqueous alkali solutions.

For coating a suitable support, the mixtures are in general dissolved in a solvent. The selection of the solvents should be matched to the envisaged coating process, the layer thickness and the drying conditions. Suitable solvents for the mixture according to the invention are ketones, such as methyl ethyl ketone, chlorinated hydrocarbons, such as trichloroethylene and 1,1,1-trichloroethane, alcohols, such as n-propanol, ethers such as tetrahydrofuran, alcohol-ethers, such as ethylene glycol monoethyl ether, and esters, such as butyl acetate. It is also possible to use mixtures which, for special purposes, can also contain solvents, such as acetonitrile, dioxane or dimethylformamide. In principle, all those solvents can be used which do not irreversibly or adversely react with the layer components.

The supports used for layer thicknesses of less than about 10 um are in most cases metals. The following may be used for offset printing plates: bright rolled, mechanically or electrochemically roughened aluminum which, if desired, has been anodically oxidized and which additionally ca also have been chemically pretreated, for example with hydrophilizing agents such as polyvinylphosphonic acid, silicates, hexafluorozirconates, hydrolysed tetraethyl orthosilicate or phosphates. Other supports comprise silicon or may be transparent sheets such as polyesters.

Coating of the support material is carried out in a known manner by spin-coating, spraying, dipping, rollers, by means of slot dies, blade-spreading or by means of a coater application.

Light sources customary in industry such as ultraviolet light sources, are used for exposure. Irradiation with electrons or a laser is another possibility for producing an image.

The aqueous-alkaline solutions which are used for developing and have graduated alkalinity, that is to say they have a pH which preferably is between 10 and 14, and which can also contain minor amounts of organic solvents or surfactants remove those areas of the copying layer which have been struck by light, and thus produce a positive image of the original. Non-limiting examples of alkalis useful for the practice of the present invention include sodium silicate sodium metasilicate, trisodium phosphate, monosodium phosphate and various alkaline hydroxides such as sodium potassium, lithium and ammonium hydroxide.

The preferred use of the light-sensitive mixtures according to the invention is in the preparation of printing plates in particular offset printing plates, using aluminum as the support.

After development, the printing plate is heated in a manner known, per se. In contrast to the process conditions hitherto customary in baking, such as are indicated, for example, in British Patent Specification 1,154,749 or German Offenlegungsschrift 2,939,785 it is possible with an addition of the melamine derivatives defined above to achieve the same increase in the print run as hitherto known, but at markedly lower temperatures or within substantially shorter periods. The baking temperatures selected can be in the range from about 150° to 240° C., preferably from 160° to 210° C., heating periods of 1-20, preferably 5 to 10, minutes being normally employed. If the support material is stable at higher temperatures, it is of course also possible to bake at higher temperatures above 240° C. and to select correspondingly shorter heating periods.

The support bared after development of the image can, before heating, also be treated in a known manner with the aqueous solution of a film-forming substance, in order to save, or at least to facilitate, the redevelopment after heating. This treatment can be useful in the process according to the invention, but it is not absolutely required. In particular when the preferred low baking temperatures are used, precipitates on the background areas of the plate are in most cases not formed at all, or they can readily be removed. If the process is carried out in the preferred manner, this step can usually be omitted.

In the description of this specification, non-limiting illustrative U.S. and foreign patents are incorporated herein by reference. The invention is explained in more detail by reference to the examples which follow, wherein parts by weight (p.b.w.) and parts by volume (p.b.v.) have the same relationship as that of the g to the $cm^3$. Unless otherwise stated, percentages are percent by weight.

EXAMPLE 1

An electrochemically roughened and anodically oxidized aluminum plate is coated with a solution of 1.40 p.b.w. of the esterification product obtained from 1 mole of 2,3,4-trihydroxy-benzophenone and 3 moles of naphthoquinone-(1,2)-diazide-(2)-5-sulfonic acid chloride, 6.30 p.b.w. of a cresol-formaldehyde novolak having a softening point of 105°-120° C., 0.20 p.b.w. of naphthoquinone-(1,2)-diazide-(2)-4-sulfonic acid chloride, 0.45 p.b.w. of hexamethylol melamine hexamethyl ether (Cymel 300 from the American Cyanamid Corp.), and 0.07 p.b.w. of crystal violet, in 40 p.b.w. of ethylene glycol monomethyl ether and 50 p.b.w. of tetrahydrofuran.

Before application of the light-sensitive copying layer, the anodically oxidized support is treated with an aqueous solution of 0.1% by weight strength polyvinylphosphonic acid as a hydrophilizing agent.

The presensitized material thus prepared and having a layer weight of 2.0 g/m$^2$, is exposed imagewise under a transparent positive original and then developed with the following solution:

7.00 p.b.w. of sodium metasilicate × 9 H$_2$O 0.02 p.b.w. of strontium hydroxide × 8 H$_2$O and 0.03 p.b.w. of levulinic acid, in 93.00 p.b.w. of water.

The areas of the copying layer, which are struck by light, are removed by the development and the unexposed image areas remain on the support. A printing image corresponding to the original is obtained. Using an offset printing press, it is possible to obtain 100,000 commercially acceptable prints from the printing plate thus prepared.

In order to extend the print run and to harden the printing image, a similarly produced printing plate is subjected to a heat treatment. For this purpose, the dried printing plate, after development, is heated in a baking oven for 5 minutes to 190° C.

As a result of heating the printing plate in the oven, the printing image is hardened and the layer becomes resistant to chemicals and thus insoluble in organic solvents, such as acetone, alcohols, dimethylformamide, toluene or xylene. 350,000 commercially acceptable copies are obtained when used on an offset printing press.

When the addition of hexamethylol melamine hexamethyl ether is omitted in Example 1, a run of only 150,000 copies is obtained under otherwise identical test conditions for the baked plate. Moreover, the printing image remains somewhat more soluble in organic solvents and not as resistant to art recognized deletion fluids.

An important advantage offered by the invention is that relatively small amounts of the cross-linking compounds of the invention in the copying layer are sufficient to render the printing image resistant to chemical attack within a short time when baked at a temperature of between 180° and 200° C. and thus to obtain a long print run. This is clearly demonstrated by a comparison with the thermo-crosslinking methylol compounds according to German Offenlegungsschrift DE-A 30 39 926. If, for instance, in Example 1 the hexamethylol melamine hexamethyl ether is replaced by the same amount of the most suitable crosslinking compounds of DE-A No. 30 39 926, such as 2,6-dimethylol-p-cresol or 2,2-bis-(4-hydroxy-3,5-dihydroxy-methyl-phenyl)-propane, these copying layers are not yet resistant after a baking time of 5 minutes at 200° C., which is, however, the case with the copying layer of Example 1. Furthermore, solvents like acetone or alcohol and deletion fluids are still able to dissolve the baked copying layer when the DE-A 30 39 926 materials are thusly used.

Only when the amount of the prior methylol compounds in the copying layers is quatrupled or, respectively, doubled, the resistance to chemicals of the present printing plate after baking is equal to that of the copying layer of Example 1, when they are baked under the same test conditions. If the amount of the methylol compounds described in DE-A No. 30 39 926 and mentioned above is not increased by the above amount, the baking temperature must be 40° to 50° C. higher in order to make the printing image resistant to such chemicals. One of the disadvantages brought about as a result of the increased temperature is a substantial reduction in the dimensional stability of the aluminum support, which makes the further handling of it much more difficult.

It is known that the dimensional stability of aluminum is irreversibly reduced at temperatures above 240° C., whereby the further handling of baked printing plates of this type is made much more difficult and often even becomes impossible.

Another advantage of the invention is that the presensitized printing plates, when stored at temperatures of 20° to 40° C. have a very long shelf like, because of their relatively low content of added crosslinking cyclical acid amides according to the invention.

The excellent storability of the copying materials prepared in accordance with the present invention becomes particularly evident when they are stored at elevated temperatures of, for example, 80° C. Thus, plate samples prepared in accordance with Example 1 of the invention, which have been stored at 80° C. for 5 hours, can be satisfactorily developed after exposure through a positive original, and the image areas can be inked with greasy ink whereas the image-free areas remain hydrophilic. If, however, in Example 1 the hexamethylol melamine hexamethyl ether is replaced by the same amount of 2,2-bis-(4-hydroxy-3,5-dihydroxymethyl-phenyl)-propane, and the plates obtained are also stored at 80° C., under otherwise unchanged conditions, the image-free areas are oleophilic after a storage time of only 30 minutes, so that upon inking with greasy ink both the image areas and the non-image areas of the plate surface are ink-receptive.

It is also of advantage that baking ovens of a lower capacity can be used.

In the Examples below, further coating solutions are described, with which similar results are obtained Unless otherwise stated, the preparation and processing of printing plates obtained using these solutions correspond to the conditions described in Example 1.

EXAMPLE 2

An electrochemically roughened and anodically oxidized aluminum plate is coated with a solution of:

2.80 parts by weight of a 50% strength solution of a poly-orthoester, prepared from 7,7-bis-hydroxymethyl5-oxa-nonan-(1)-ol and trimethyl orthoformate, in toluene, 0.23 part by weight of 2-(4-ethoxy-naphth-1-yl)-4, 6-bis-trichloromethyl-s-triazine, 3.30 parts by weight of the novolak indicated in Example 1, 0.50 part by weight of hexamethylol melamine hexamethyl ether and 0.04 part by weight of crystal violet in 90.00 parts by weight of butanone.

The printing plate thus prepared is exposed imagewise for 10 seconds at a distance of 110 cm under a 5 kW metal halide lamp and then developed with the developer indicated in Example 1.

The baking time of 5 minutes at 190° C. is sufficient for the hardening of the printing image. Without the hexamethylol melamine hexamethyl ether, a baking temperature of 240° C. is required to achieve a comparably good resistance.

EXAMPLE 3

An electrochemically roughened and anodically oxidized aluminum plate, the surface of which has been pretreated with an aqueous solution of polyvinylphospohonic acid, is coated with a solution of:

1.36 p.b.w. of the esterification product obtained from 1 mole of the ethoxyethyl ester of 4,4-bis-(4-hydroxyphenyl)-n-valeric acid and 2 moles of naphthoquinone-(1,2)-diazide-(2)-5-sulfonic acid chloride, 0.18 p.b.w. of naphthoquinone-(1,2)-diazide-(2)-4-sulfonic acid chloride 4.6 p.b.w. of the novolak indicated in Example 1, 0.35 p.b.w. of hexamethylol melamine and 0.07 p.b.w. of crystal violet in 100.00 p.b.w. of ethylene glycol monoethyl ether.

A baking time of 5 minutes at 200° C. is sufficient for the hardening of the printing stencil.

EXAMPLE 4

An aluminum plate which has been mechanically roughened by brushing with a wire brush is coated with a solution of 2.0 p.b.w. of 1-(4-methyl-benzene sulfonylimino)-2-(2-ethylphenyl-aminosulfonyl)-benzoquinone-(1,4)-diazide-(4),
0.5 p.b.w. of a cresol-formaldehyde novolak modified with chloroacetic acid (described in Example 5 of DE-A 1 053 930),
2.0 p.b.w. of the novolak indicated in Example 1, and
0.5 p.b.w. of hexamethylol melamine hexabutyl ether, in
60 p.b.w. of ethylene glycol monomethyl ether and
15 p.b.w. of butyl acetate.

A baking time of 5 minutes at 190° C. is sufficient for hardening the printing stencil.

EXAMPLE 5

An electrochemically roughened and anodically oxidized aluminum plate is coated with a solution of:

2.5 p.b.w. of bis-(5-ethyl-5-butyl-1,3-dioxan-2-yl)-ether of 2-ethyl-2-butyl-1,3-propane-diol,
7.1 p.b.w. of the cresol-formaldehyde novolak indicated in Example 1,
0.3 p.b.w. of 2-(acenaphth-5-yl)-4,6-bis-trichloromethyl-s-triazine,
0.07 p.b.w. of crystal violet base and
0.5 p.b.w. of hexamethylol melamine hexamethyl ether in
90 p.b.w. of ethylene glycol monomethyl ether.

A baking time of 5 minutes at 190° C. is sufficient for the hardening of the printing stencil.

Similar results are achieved when a polyacetal as described in DE-A No. 27 18 254 is used instead of the ortho-ester derivative indicated above.

What is claimed is:

1. A process for the preparation of a photographic element comprising providing a light-sensitive photographic element comprising a support and a light sensitive layer on said support, which layer comprises in admixture, a binding amount of a water-insoluble binder, which is soluble in aqueous-alkaline solutions; and a light sensitizing amount of a light-sensitive component selected from the group consisting of o- or p-quinone-diazides; diazonium salt polycondensation products or a mixture of
   a) a compound which eliminates an acid on exposure to light and
   b) a compound having at least one C—O—C group which can be split by acid;
and a thermo-crosslinking compound, which thermo-crosslinking compound is a cyclical acid amide of the general formula:

$$\begin{array}{c} R-O-H_2C \quad CH_2-O-R \\ \diagdown \quad \diagup \\ N \\ | \\ C \\ \diagup \quad \diagdown \\ R-O-H_2C \quad N \quad N \quad CH_2-O-R \\ \diagdown \quad \| \quad | \quad \diagup \\ N-C \quad C-N \\ \diagup \quad \diagdown \quad \diagup \quad \diagdown \\ R-O-H_2C \quad N \quad CH_2-O-R \end{array}$$

wherein R denotes a hydrogen atom or an alkyl group and said binding amount is that amount which produces a difference between the exposed and unexposed areas of said element upon development, and the amount of thermo-crosslinking compound present is an amount which does not substantially reduce the shelf life of said composition and which enables said composition to be baked at lower temperatures than a similar composition without the thermo-crosslinking compound and without substantially reducing the developer resistance of said composition; imagewise exposing said copying material to actinic light or electrons; removing the non-image area of the layer with an aqueous-alkaline developer solution; and heating the material to an elevated temperature sufficient to harden the image layer.

2. The process of claim 1 wherein said aqueous alkaline developer solution comprises one or more compounds selected from the group consisting of sodium silicate, sodium metasilicate, trisodium phosphate, monosodium phosphate and alkaline hydroxides.

3. The process of claim 1 wherein said heating step is conducted at a temperature of from about 150° C. to about 240° C. for a time period of from about 1 to about 20 minutes.

4. The process of claim 1 wherein said heating step is conducted at a temperature of from about 160° C. to about 210° C. for a time period of from about 5 to about 10 minutes.

5. The process of claim 1 wherein said support comprises aluminum, silicon or polyester.

6. The process of claim 1 wherein said support comprises aluminum and wherein the surface of said aluminum support bearing said light sensitive layer has been treated by one or more processes selected from the group consisting of bright rolling, mechanical roughening, electrochemical roughening, anodization and hydrophilization.

7. The process of claim 1, wherein the cyclical acid amide is present in the light sensitive layer in an amount of between 1 and 20 percent by weight.

8. The process of claim 1 wherein R has from 1 to about 10 carbon atoms.

9. The process of claim 1 wherein R has from 1 to 4 carbon atoms.

10. The process of claim 1 wherein the cross-linking agent is hexamethylol melamine hexamethyl ether.

11. The process of claim 1, wherein the binder which is soluble in aqueous-alkaline solutions is a novolak resin.

12. The process of claim 1, wherein the binder is present in the light sensitive layer in an amount of from about 50% to about 90 % by weight.

13. The process of claim 1 wherein the light sensitive component is an o-quinone diazide.

14. The process of claim 1 wherein the light sensitive component is selected from the group consisting of naphthoquinone-(1,2)-diazide-(2)-4 or 5-sulfonic acid esters or amides.

15. The process of claim 1 wherein the o-quinone diazide is present in the light sensitive layer in an amount of from about 3% to about 50% by weight.

16. The process of claim 1 wherein the light sensitive component is a mixture of compounds (a) and (b) wherein (a) is present in an amount of from about 8% to about 65% by weight of said light sensitive layer and (b) is present in an amount of from about 0.1% to about 10% by weight of said light sensitive layer.

17. The process of claim 1 wherein the exposure is conducted with ultraviolet light.

18. The process of claim 1 wherein the exposure is conducted with a laser.

19. The process of claim 1 wherein said support comprises silicon, R has from 1 to about 10 carbon atoms, the light sensitive component is an o-quinone diazide, and wherein the exposure is conducted with ultraviolet light.

20. The process of claim 19 wherein the cross-linking agent is hexamethylol melamine hexamethyl ether and wherein the light sensitive component is selected from the group consisting of naphthoquinone-(1,2)-diazide-(2)-4 or 5-sulfonic acid esters or amides.

* * * * *